(12) United States Patent
Lawson (10) Patent No.: US 6,538,230 B2
(45) Date of Patent: Mar. 25, 2003

(54) METHOD AND APPARATUS FOR IMPROVING LASER HOLE RESOLUTION

(75) Inventor: William E. Lawson, Somerset, WI (US)

(73) Assignee: Preco Laser Systems, LLC, Somerset, WI (US)

( * ) Notice: Subject to any disclaimer, the term of this patent is extended or adjusted under 35 U.S.C. 154(b) by 0 days.

(21) Appl. No.: 09/860,133

(22) Filed: May 17, 2001

(65) Prior Publication Data

US 2002/0170886 A1 Nov. 21, 2002

(51) Int. Cl.$^7$ .............................................. B23K 26/00
(52) U.S. Cl. .............................. 219/121.71; 219/121.7; 219/121.67
(58) Field of Search ...................... 219/121.71, 121.6, 219/121.85, 121.7, 121.67

(56) References Cited

U.S. PATENT DOCUMENTS

| | | | | |
|---|---|---|---|---|
| 5,363,126 A | | 11/1994 | Andrews | 346/108 |
| 5,449,879 A | * | 9/1995 | Lawson et al. | 219/121.74 |
| 5,500,506 A | * | 3/1996 | Lawson | 219/121.67 |
| 5,638,110 A | * | 6/1997 | Curry et al. | 347/253 |
| 5,658,474 A | * | 8/1997 | Geerke | 219/121.71 |
| 5,916,462 A | * | 6/1999 | James et al. | 219/121.71 |
| 6,057,525 A | * | 5/2000 | Chang et al. | 219/121.73 |
| 6,137,522 A | * | 10/2000 | Melino et al. | 347/233 |
| 6,177,648 B1 | * | 1/2001 | Lawson et al. | 219/121.62 |
| 6,222,157 B1 | * | 4/2001 | Langille et al. | 219/121.69 |
| 6,423,932 B1 | * | 7/2002 | Lawson | 219/121.7 |

* cited by examiner

*Primary Examiner*—M. Alexandra Elve
(74) *Attorney, Agent, or Firm*—Kinney & Lange, P.A.

(57) ABSTRACT

A high resolution, high speed laser drilling system for operating on an advancing product operates to advances the product in a predetermined product advancement path at a product advancement speed. A laser-generating source provides a pulsed laser beam having a laser-on time and a laser-off time. The laser beam is reflected to direct a focal point of the laser beam onto the advancing product. The focal point of the laser beam is moved in a direction of the product advancement path during the laser-on time and is moved in a direction opposite to the direction of the product advancement path during the laser-off time. The system is therefore able to improve laser drilling resolution for a given product advancement speed.

14 Claims, 7 Drawing Sheets

METHOD AND APPARATUS FOR IMPROVING LASER HOLE RESOLUTION

BACKGROUND OF THE INVENTION

The present invention relates to a high speed laser drilling system, and more particularly to a method of operating a laser drilling system to achieve improved laser hole resolution without sacrificing product advancement speed.

Laser systems are often employed to create uniformly spaced holes in a product material such as an advancing web, and such systems are advantageous because of the high product advancement speed and laser hole resolution that can be achieved. Similarly configured systems are used to create holes in continuously fed sheets and in products advanced on a conveyor. However, there are particular hole size and spacing configurations that limit the product advancement speed and/or laser hole resolution because of the constraint of laser turn-on and turn-off times. Specifically, where holes are spaced a relatively large distance apart in comparison to the size of the holes, laser turn-on and turn-off times can limit the speed of product advancement or the resolution of the laser holes. For example, if the product advances at too high of a speed, the laser may remain on for too long and therefore create too large of a hole. Therefore, a method of operating a laser drilling system that enables high laser hole resolution without sacrificing product advancement speed would be a significant improvement in the art.

BRIEF SUMMARY OF THE INVENTION

The present invention is a method and apparatus for high resolution, high speed laser drilling of an advancing product. A product is advanced in a predetermined product advancement path at a web advancement speed. A laser-generating source provides a pulsed laser beam having a laser-on time and a laser-off time. The laser beam is reflected to direct a focal point of the laser beam onto the web. The focal point of the laser beam is moved in a direction of the product advancement path during the laser-on time and is moved in a direction opposite to the direction of the product advancement path during the laser-off time. The present invention is therefore able to improve laser drilling resolution for a given product advancement speed.

DETAILED DESCRIPTION

Figure 1:
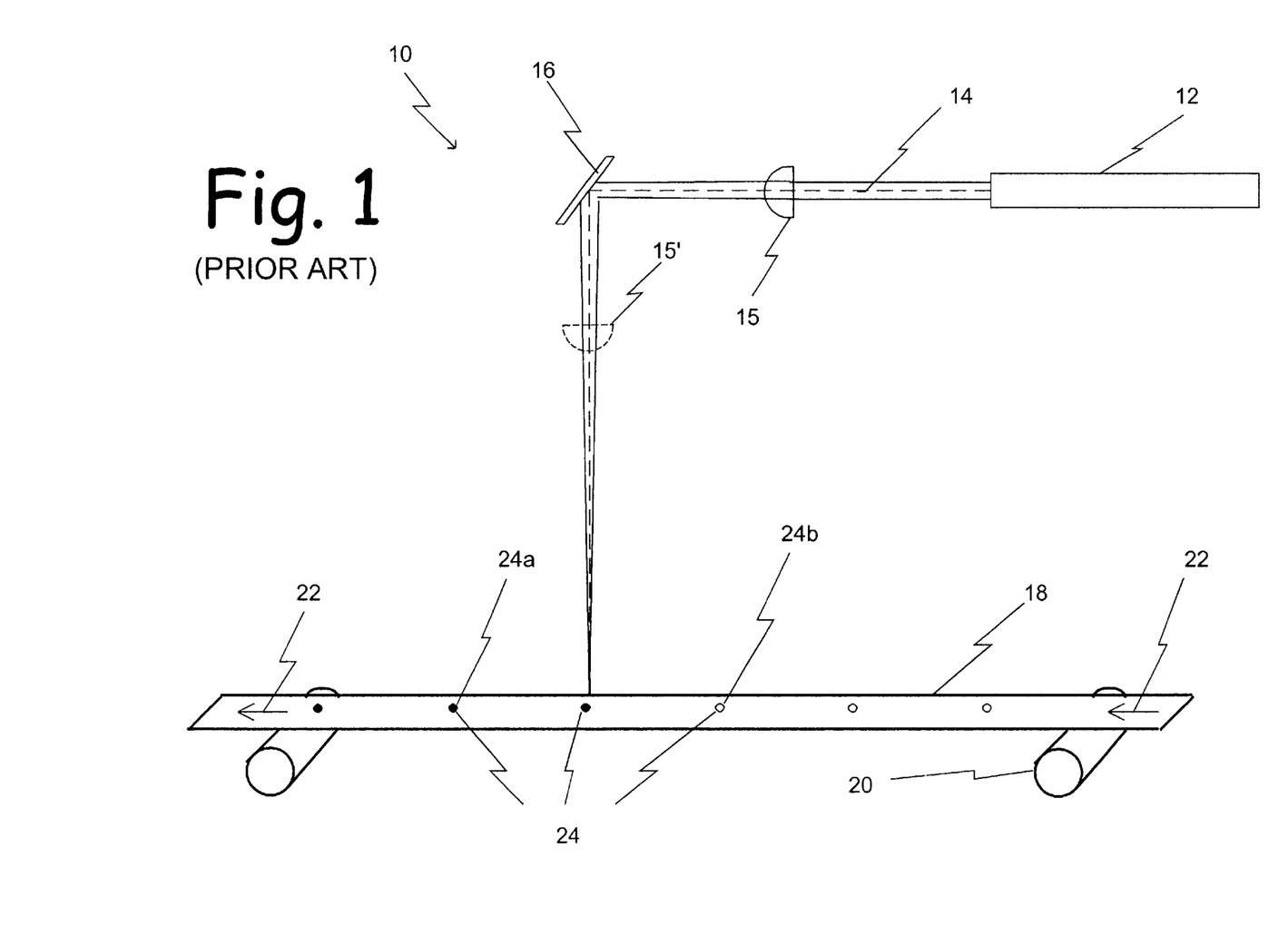
FIG. 1 is a diagram of a prior art laser drilling system for operating on a moving product such as a web.

FIG. 1 is a diagram of prior art laser drilling system 10. Laser source 12 generates laser beam 14, which is focused by lens 15 and reflected by properly positioned stationary mirror 16 in a target direction onto advancing web 18. Lens 15 may alternatively be positioned between stationary mirror 16 and advancing web 18, as shown in phantom by the position of lens 15'. Lens 15 focuses laser beam 14 so that it is a high resolution spot at the point where it impinges upon web 18. Web 18 is carried by rollers 20 or a similar advancement mechanism known in the art, moving in the direction indicated by arrows 22. In other embodiments, web 18 may be replaced by a conveyor carrying a series of products to be worked on by laser beam 14 or a series of sheets fed through the path of laser beam 14, for example. The pulsing rate of laser source 12 and the speed of advancement of web 18 (or of other advancing product in other embodiments) on rollers 20 are controlled to match a set hole pattern 24, which is represented in FIG. 1 as a group of drilled holes 24a (shown as darkened circles) and a group of yet-to-be-drilled holes 24b (shown as empty circles). As discussed above in the background of the invention, where hole pattern 24 comprises relatively small holes spaced a relatively large distance apart, the minimum "on-time" of laser source 12 can result in too large of a hole at high speeds of advancement of web 18. Therefore, either the hole resolution or the web advancement speed must be sacrificed in operating the laser drilling system.

The present invention addresses this problem associated with prior art laser drilling systems by providing a system for moving the focused laser beam spot at the point where it impinges on the advancing web/product in the same direction as the web/product is moving. The "effective speed" of the web/product in relation to the focused laser beam spot is therefore reduced by the speed of the spot. As a result, higher laser hole resolution may be achieved for a particular absolute web/product advancement speed, since the effective speed of the web/product with respect to the spot is reduced. Several exemplary embodiments are described below with respect to FIGS. 2–7 for providing systems to move the focused laser beam spot according to the general principles of the present invention, shown for use with an advancing web as an exemplary embodiment.

Figure 2:
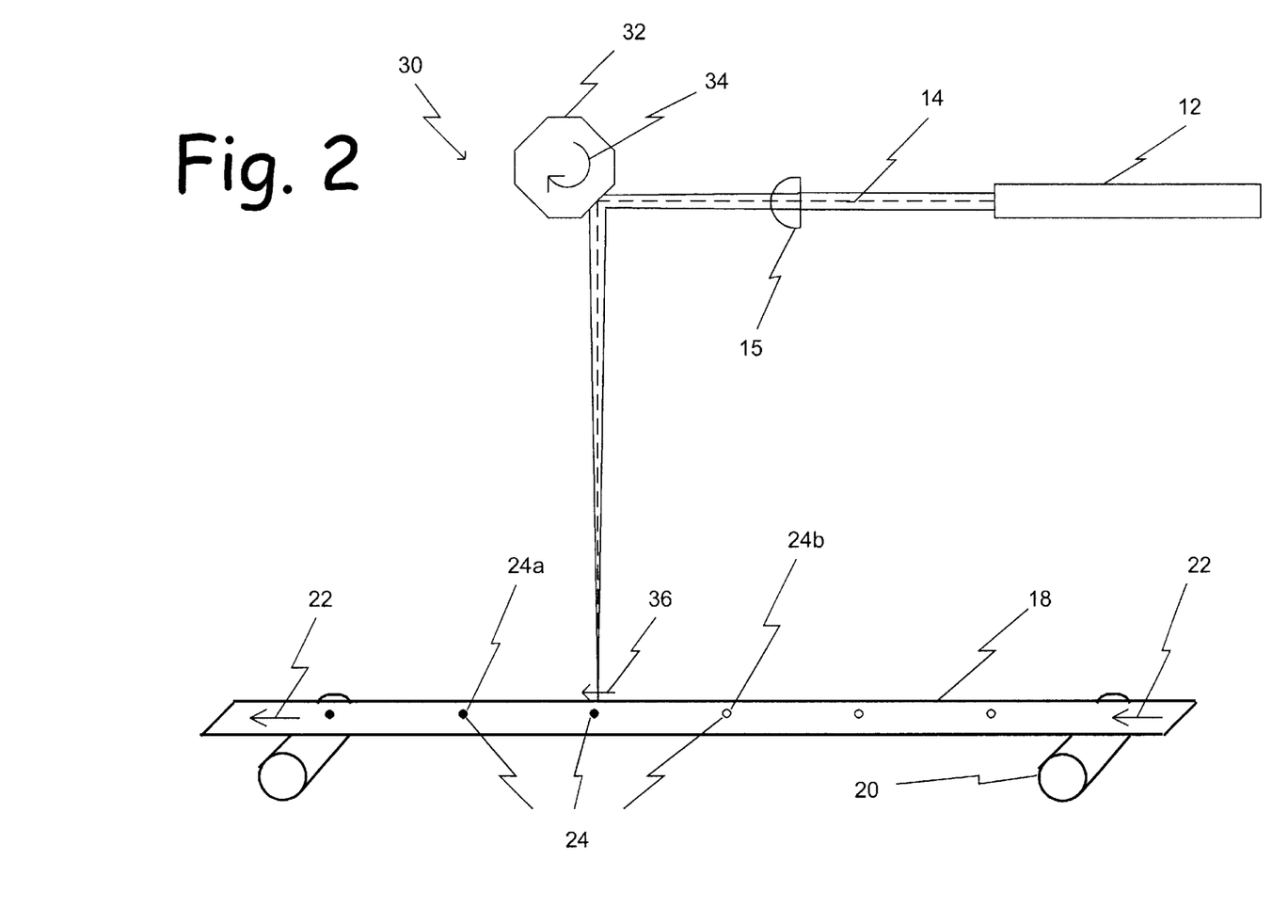
FIG. 2 is a diagram of a laser drilling system for operating on a moving web employing a rotating polygon scanner according to a first embodiment of the present invention.

FIG. 2 is a diagram of laser drilling system 30 according to a first embodiment of the present invention. Laser source 12 generates laser beam 14, which is focused by lens 15 and reflected onto advancing web 18 by rotating polygon scanner 32. Web 18 is carried by rollers 20 or a similar advancement mechanism known in the art, moving in the direction indicated by arrows 22. Rotation of polygon scanner 32 around its axis in the direction indicated by arrow 34 results in linear movement of the focal point of laser beam 14 on web 18 in the direction of arrow 36 as a side of polygon scanner 32 rotates across the impingement position of laser beam 14 on polygon scanner 32. When the adjacent side of polygon scanner 32 rotates to the impingement position of laser beam 14 on the scanner, the focal point of laser beam 14 on web 18 jumps back in the direction opposite of arrow 34 on web 18, and then gradually moves in the direction of arrow 34 again as polygon scanner 32 continues to rotate. The speed of rotation of polygon scanner is synchronized with the speed of advancement of web 18 so that the difference between the speed of advancement of web 18 and the speed of movement of the focal point of laser 14 on web 18 is low, enabling a high resolution laser hole to be drilled while web 18 advances at a relatively high speed. In addition, the length of the sides and number of sides of polygon scanner 32, as well as the pulsing rate of laser beam 14, are coordinated with the spacing of laser hole pattern 24, to achieve the proper spacing between holes.

Figure 3:
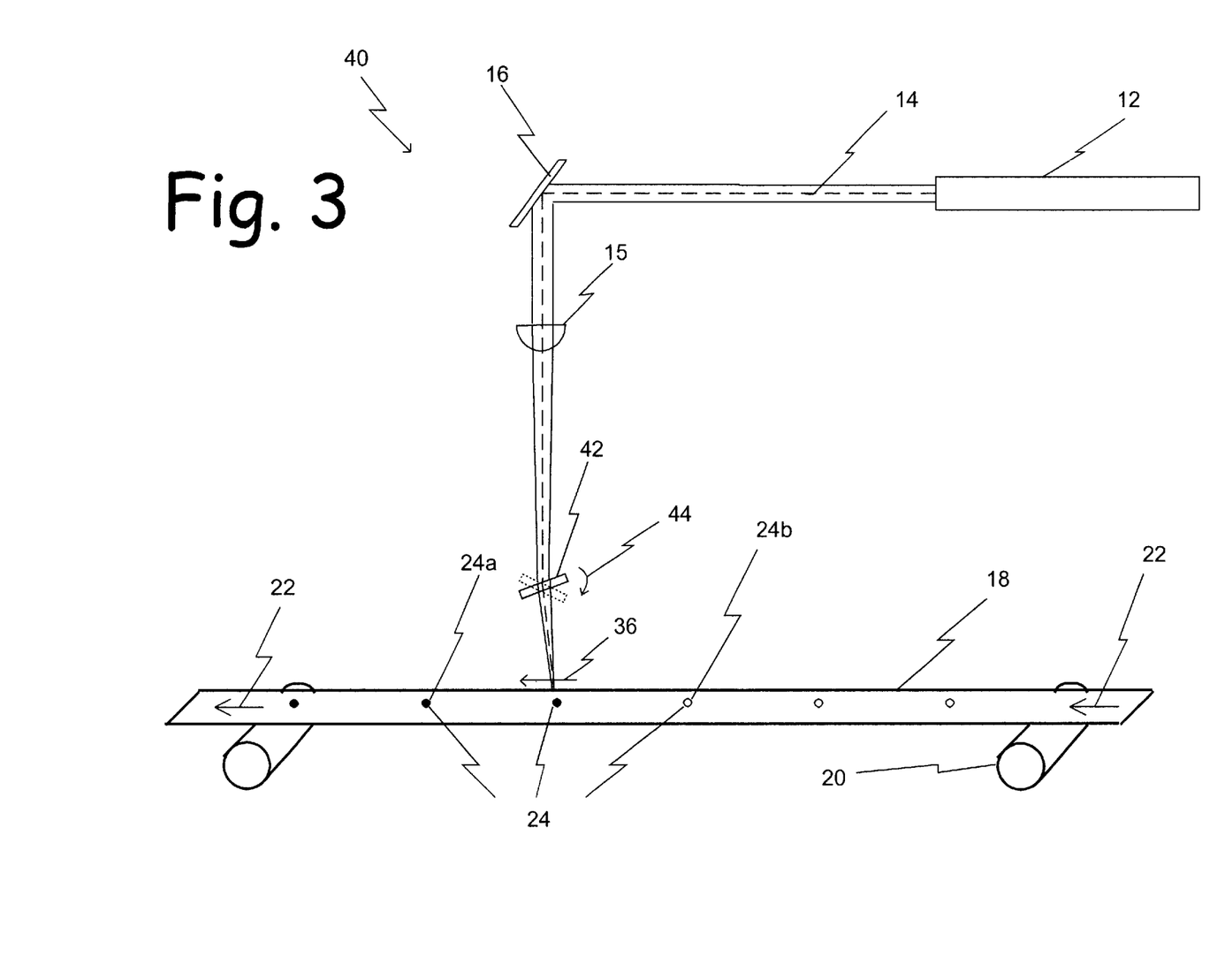
FIG. 3 is a diagram of a laser drilling system for operation on a moving web employing an angularly adjustable refracting material according to a second embodiment of the present invention.

FIG. 3 is a diagram of laser drilling system 40 according to a second embodiment of the present invention. Laser source 12 generates laser beam 14, which is reflected by stationary mirror 16 and focused by lens 15 onto advancing web 18. Web 18 is carried by rollers 20 or a similar advancement mechanism known in the art, moving in the direction indicated by arrows 22. Angularly adjustable refracting element 42 is located in the path of laser beam 14 between lens 15 and web 18. The angular orientation of refracting element 42 is controlled to move in the direction indicated by arrow 44, which adjusts the refracted angle of the laser beam within refracting element 42, resulting in a parallel offset of laser beam 14 exiting refracting element 42 and moving the focused laser beam spot impinging upon web 18 in the direction indicated by arrow 36. Thus, during the "on time" of the laser, refracting element 42 is gradually rotated from the position shown in solid lines to the position shown in phantom lines, to move the focused laser beam spot in the same direction as the advancement of web 18. The effective speed of the focused laser beam spot is therefore equal to the difference between the speed of advancement of web 18 and the speed of movement of the focused laser beam spot. During the "off time" of the laser, refracting element 42 returns to the position shown in solid lines. The adjustment of the angular orientation of refracting element 42 is synchronized and coordinated with the advancement of web 18 to achieve the proper size and spacing of the holes drilled in web 18. The embodiment shown in FIG. 3 thus achieves the same advantages discussed above with respect to FIG. 2.

Figure 4:
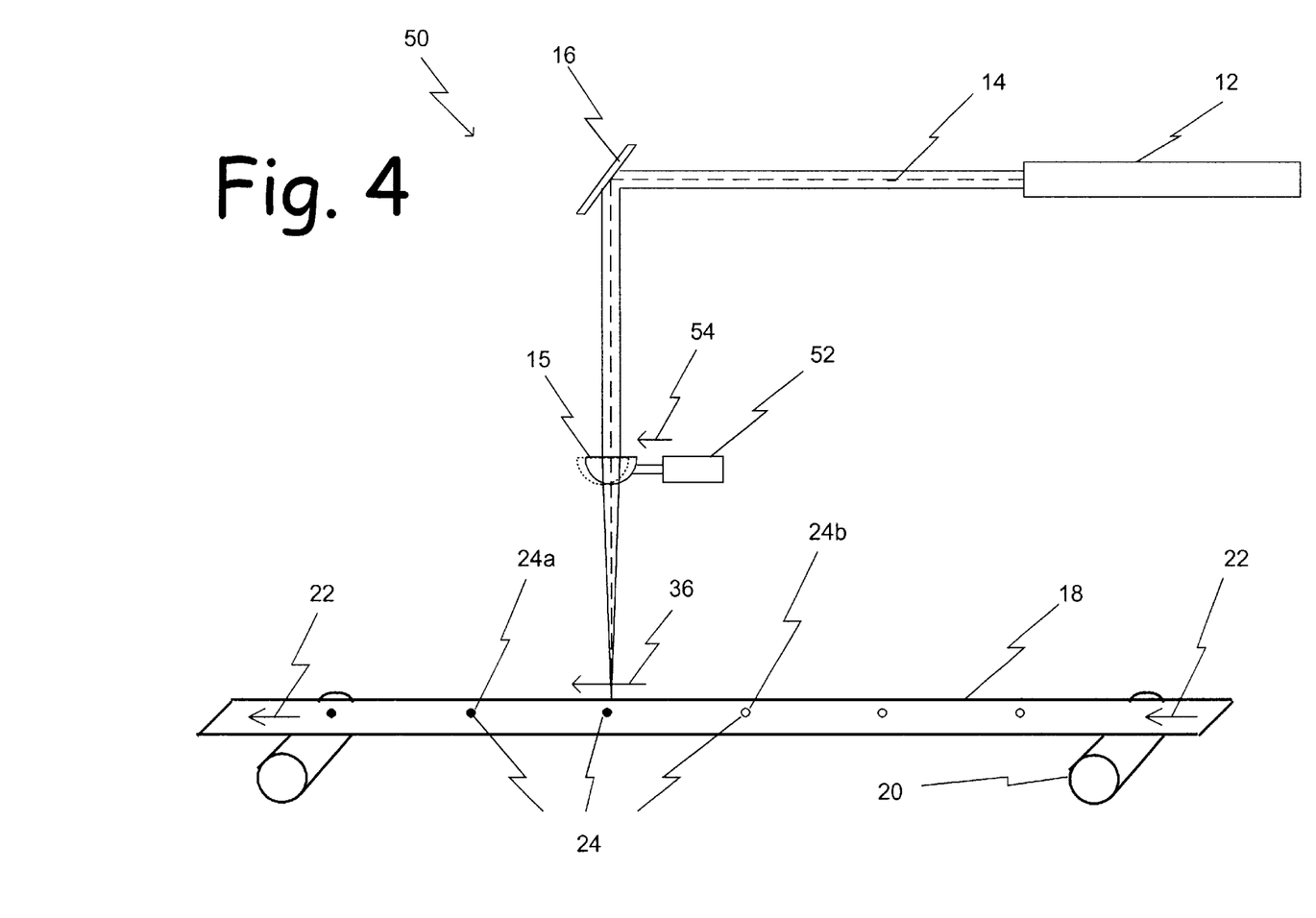
FIG. 4 is a diagram of a laser drilling system for operating on a moving web employing a linearly actuated lens according to a third embodiment of the present invention.

FIG. 4 is a diagram of laser drilling system 50 according to a third embodiment of the present invention. Laser source 12 generates Laser beam 14, which is reflected by stationary mirror 16 and focused by lens 15 onto advancing web 18. Web 18 is carried by rollers 20 or a similar advancement mechanism known in the art, moving in the direction indicated by arrows 22. The position of lens 15 is linearly adjustable by actuator 52 in the direction of arrow 54, which causes the position of the focused laser beam spot impinging upon web 18 to move in the direction of arrow 36. Thus, during the "on time" of the laser, lens 15 is gradually moved in the direction of arrow 54 by actuator 52, from the position shown in solid lines to the position shown in phantom lines, to move the focused laser beam spot in the same direction as the advancement of web 18. The effective speed of the focused laser beam spot is therefore equal to the difference between the speed of advancement of web 18 and the speed of movement of the focused laser beam spot. During the "off time" of the laser, lens 15 is returned to the position shown in solid lines. The movement of lens 15 by actuator 52 is synchronized and coordinated with the advancement of web 18 to achieve the proper size and spacing of the holes drilled in web 18. The embodiment shown in FIG. 4 thus achieves the same advantages discussed above with respect to FIG. 2.

Figure 5:
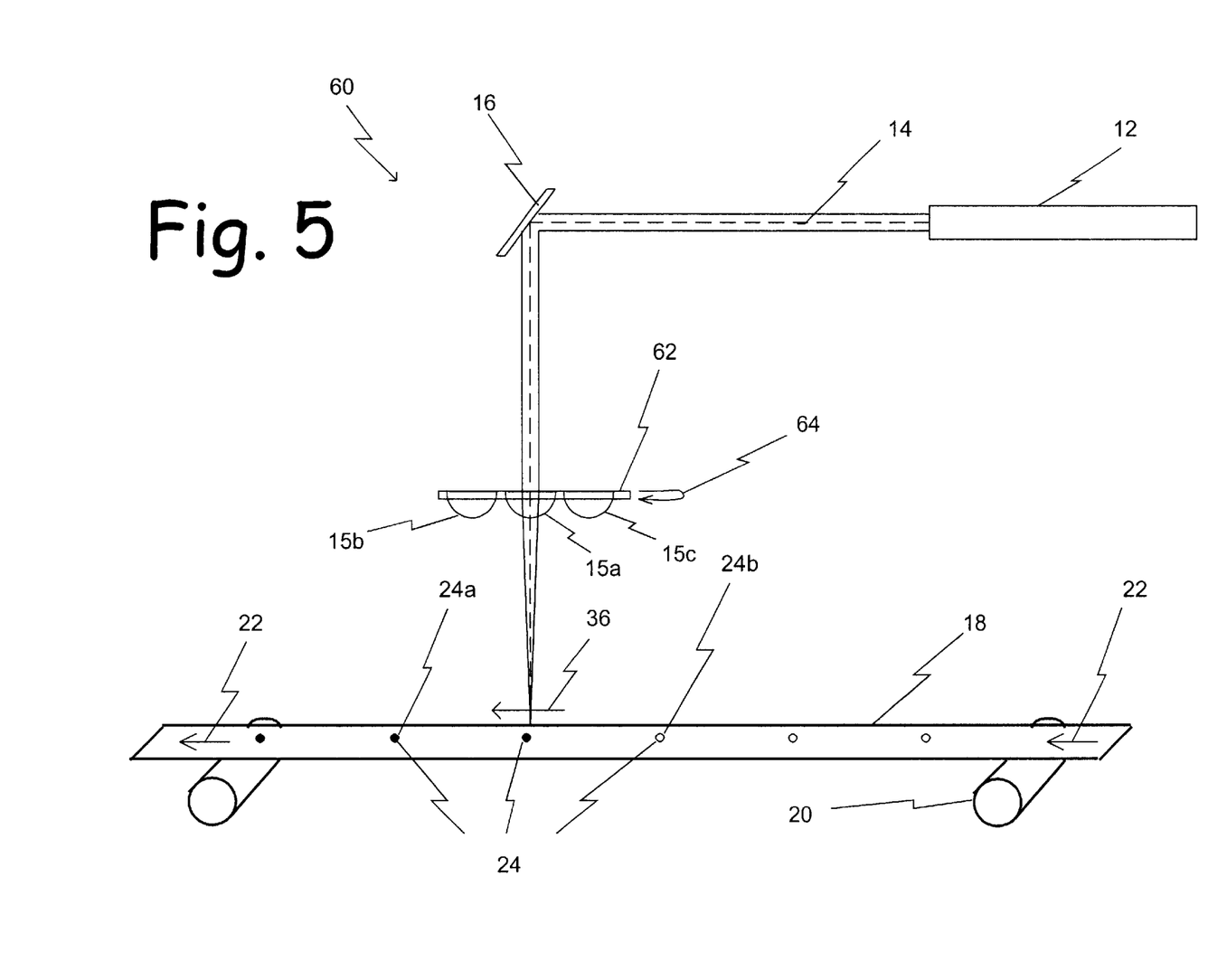
FIG. 5 is a diagram of a laser drilling system for operating on a moving web employing a rotating disk having a plurality of lenses mounted thereon according to a fourth embodiment of the present invention.
Figure 6:
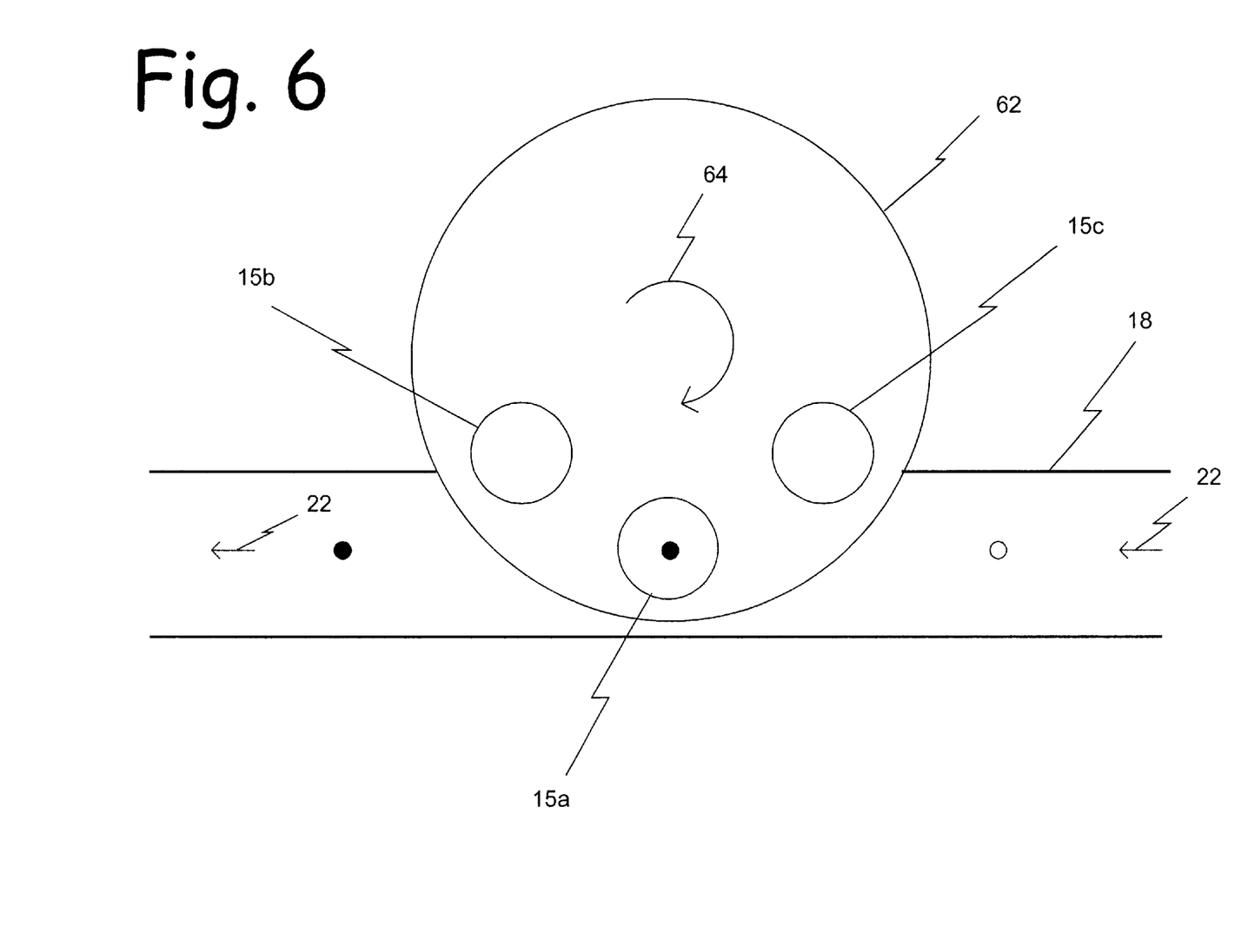
FIG. 6 is a top view of the rotating disk employed in the laser drilling system shown in FIG. 5.

FIG. 5 is a diagram of laser drilling system 60 according to a fourth embodiment of the present invention. Laser source 12 generates laser beam 14, which is reflected by stationary mirror 16 and focused by a lens onto advancing web 18. Web 18 is carried by rollers 20 or a similar advancement mechanism known in the art, moving in the direction indicated by arrows 22. Rotating disk 62, which is shown in a top view to illustrate greater detail in FIG. 6, carries a plurality of lenses 15a, 15b and 15c. It should be understood that an exemplary configuration of disk 62 will include a plurality of lenses around the entire circumference of disk 62, but only lenses 15a, 15b and 15c are shown for the purpose of simplicity and clarity. Disk 62 continually rotates around its axis in a plane generally parallel to the plane of web 18 as indicated by arrow 64. The position of the lens that is aligned with laser beam 14 therefore moves roughly linearly, which causes the position of the focused laser beam spot impinging upon web 18 to move in the direction of arrow 36. Thus, during the "on time" of the laser, the aligned lens (lens 15a in FIG. 5) is linearly moved in a manner that moves the focused beam spot in the same direction as the advancement of web 18. The effective speed of the focused laser beam spot is therefore equal to the difference between the speed of advancement of web 18 and the speed of movement of the focused laser beam spot. During the "off time" of the laser, the next lens carried by disk 62 (lens 15c in FIG. 5) moves into the position aligned with laser beam 14. The rotation of disk 62 (and the resultant positioning of lenses 15a, 15b, and 15c) is synchronized and coordinated with the advancement of web 18 to achieve the proper size and spacing of the holes drilled in web 18. The embodiment shown in FIGS. 5 and 6 thus achieves the same advantages discussed above with respect to FIG. 2.

Figure 7:
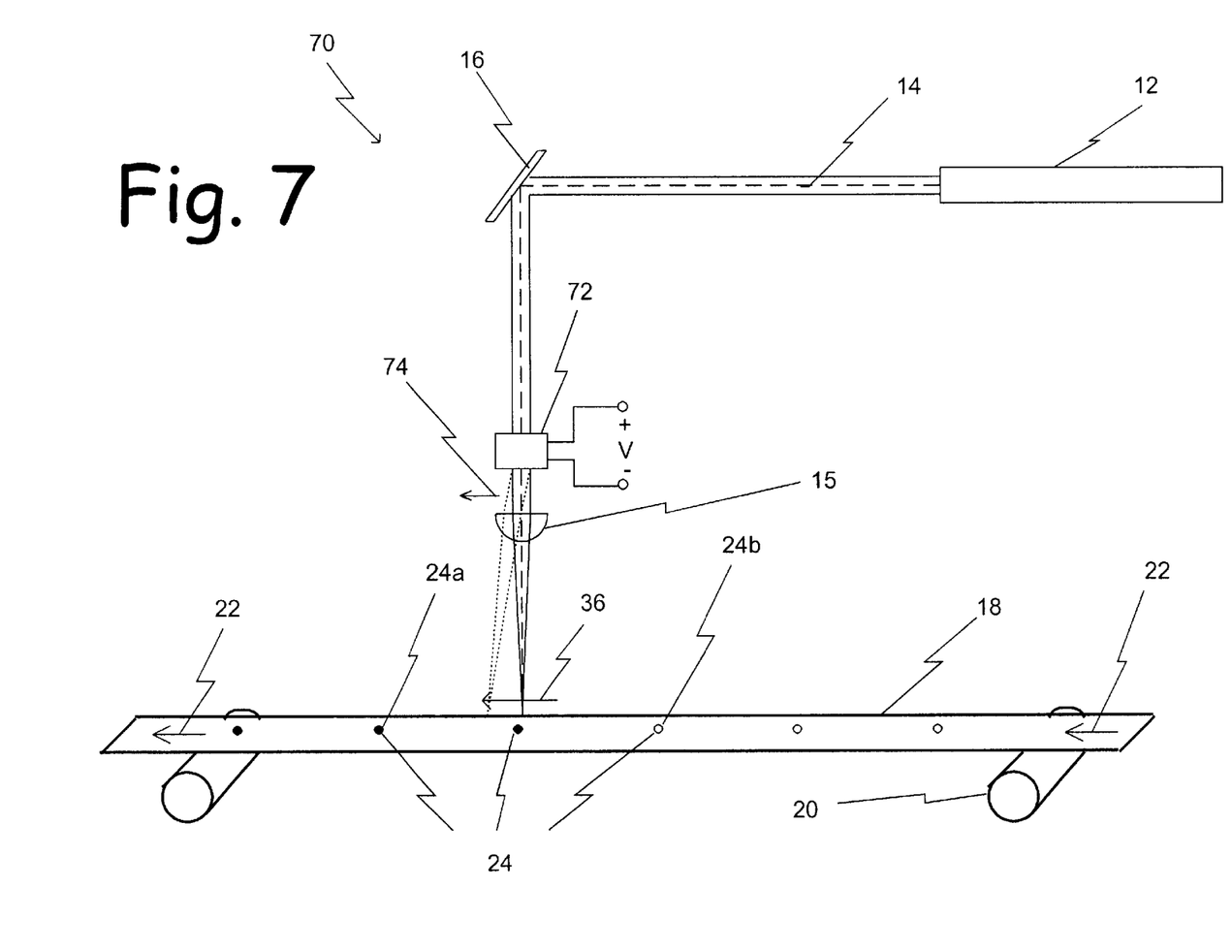
FIG. 7 is a diagram of a laser drilling system for operating on a moving web employing an optical deflector according to a fifth embodiment of the present invention.

FIG. 7 is a diagram of laser drilling system 70 according to a fifth embodiment of the present invention. Laser source 12 generates laser beam 14, which is reflected by stationary mirror 16 toward web 18. Web 18 is carried by rollers 20 or a similar advancement mechanism known in the art, moving in the direction indicated by arrows 22. Electro-optic modulator 72 and lens 15 are located in the path of laser beam 14, with lens 15 focusing laser beam onto web 18. Electro-optic modulator 72 is controlled by voltage signal V to gradually adjust an angle of refraction of laser beam 14 through electro-optic modulator 72 in the direction of arrow 74, which moves the focused laser beam spot impinging upon web 18 in the direction of arrow 36. Thus, during the "on time" of the laser, electro-optic modulator 72 is controlled to gradually adjust the angle of refraction of laser beam 14 from the position shown in solid lines to the position shown in phantom lines, to move the focused laser beam spot in the same direction as the advancement of web 18. The effective speed of the focused laser beam spot is therefore equal to the difference between the speed of advancement of web 18 and the speed of movement of the focused laser beam spot. During the "off time" of the laser, the angle of refraction of electro-optic modulator 72 is controlled to return to the position shown in solid lines. The controlled angular refraction of electro-optic modulator 72 is synchronized and coordinated with the advancement of web 18 to achieve the proper size and spacing of the holes drilled in web 18. The embodiment shown in FIG. 7 thus achieves the same advantages discussed above with respect to FIG. 2.

As a result of the present invention, the advancement of a web material may be performed at quite high speeds without concern for low hole resolution due to a minimum laser-on time, since the "effective speed" of the web during laser-on time is the difference between the advancement speed of the web and the speed of movement of the focal point of the laser due to implementation of a mechanism for moving the focused laser beam spot in the same direction as movement of the web. For particularly widely spaced patterns of small laser holes, the present invention can improve web advancement speed by as much as twenty times, utilizing the full pulsing capability of the laser at maximum web speed. For example, in an exemplary embodiment the achievable laser hole resolution improved from sixty thousandths of an inch diameter holes to three thousandths of an inch laser holes. It should be understood from the above description of the present invention that configurations shown for moving the focused laser beam spot are merely examples of suitable mechanisms for performing the function of the invention. Other scanning devices such as a galvo scanner, a resonant scanner, a holographic scanner, or other mechanisms known in the art may also be used to implement the present invention.

Although the present invention has been described with reference to preferred embodiments, workers skilled in the art will recognize that changes may be made in form and detail without departing from the spirit and scope of the invention.

What is claimed is:

1. A method of high resolution, high speed laser drilling of an advancing product, the method comprising:

advancing the product in a predetermined product advancement path at a product advancement speed;

generating a pulsed laser beam having a laser-on time and a laser-off time; and reflecting the laser beam to direct a focal point of the laser beam onto the advancing product;

drilling a high resolution hole in the product by moving the focal point of the laser beam in a direction of the product advancement path during the laser-on time to reduce the effective speed of product with respect to the laser beam; and moving the focal point of the laser beam in a direction opposite to the direction of the product advancement path during the laser-off time.

2. The method of claim 1, wherein the focal point of the laser beam is moved at a speed no greater than the product advancement speed in the direction of the product advancement path during the laser-on time.

3. The method of claim 1, wherein reflecting the laser beam to direct the focal point of the laser beam onto the advancing product, moving the focal point of the laser beam in the direction of the product advancement path during the laser-on time and moving the focal point of the laser beam in a direction opposite to the direction of the product advancement path during the laser-off time comprises:

providing a reflecting polygon having a plurality reflecting sides for directing the laser beam onto the advancing product; and rotating the reflecting polygon so that rotation of a reflecting side causes movement of the focal point of the laser beam in the direction of the product advancement path during laser-on time and rotation between reflecting sides causes movement of the focal point of the laser beam in the direction opposite to the direction of the product advancement path during laser-off time.

4. The method of claim 1, wherein moving the focal point of the laser beam in the direction of the product advancement path and moving the focal point of the laser beam in a direction opposite to the direction of the product advancement path comprises:

providing a refracting element in a path of the laser beam;

gradually adjusting an angular orientation of the refracting element during the laser-on time to move the focal point of the laser beam in the direction of the product advancement path; and adjusting the angular orientation of the refracting element during the laser-off time to move the focal point of the laser beam opposite to the direction of the product advancement path.

5. The method of claim 1, wherein moving the focal point of the laser beam in the direction of the product advancement path and moving the focal point of the laser beam in a direction opposite to the direction of the product advancement path comprises:

providing a focusing lens in a path of the laser beam;

gradually adjusting a linear position of the focusing lens during the laser-on time to move the focal point of the laser beam in the direction of the product advancement path; and adjusting the linear position of the focusing lens during the laser-off time to move the focal point of the laser beam opposite to the direction of the product advancement path.

6. The method of claim 1, wherein moving the focal point of the laser beam in the direction of the product advancement path and moving the focal point of the laser beam in a direction opposite to the direction of the product advancement path comprises:

providing a disk carrying a plurality of focusing lenses in a path of the laser beam; and continually rotating the disk so that a selected one of the plurality of focusing lenses is positioned in the path of the laser beam during the laser-on time to move the focal point of the laser beam in the direction of the product advancement path, and so that a portion of the rotating disk between adjacent ones of the plurality of focusing lenses is positioned in the path of the laser beam during the laser-off time to move the focal point of the laser beam opposite to the direction of the product advancement path.

7. The method of claim 1, wherein moving the focal point of the laser beam in the direction of the product advancement path and moving the focal point of the laser beam in a direction opposite to the direction of the product advancement path comprises:

providing an electro-optic modulator in a path of the laser beam;

gradually adjusting a signal applied to the electro-optic modulator during the laser-on time to move the focal point of the laser beam in the direction of the product advancement path; and adjusting a signal applied to the electro-optic modulator during the laser-off time to move the focal point of the laser beam opposite to the direction of the product advancement path.

8. Apparatus for high resolution, high speed laser drilling of an advancing product, comprising:

means for advancing the product in a predetermined product advancement path at a product advancement speed;

a laser-generating source providing a pulsed laser beam having a laser-on time and a laser-off time;

means for reflecting the laser beam to direct a focal point of the laser beam onto the advancing product;

means for drilling a high resolution hole in the product by moving the focal point of the laser beam in a direction of the product advancement path during the laser-on time and for moving the focal point of the laser beam in a direction opposite to the direction of the product advancement path during the laser-off time.

9. The apparatus of claim 8, wherein the means for moving the focal point of the laser beam is operable to move the focal point of the laser beam at a speed no greater than the product advancement speed in the direction of the product advancement path during the laser-on time.

10. The apparatus of claim 8, wherein the means for moving the focal point of the laser beam comprises an angularly adjustable refracting element in a path of the laser beam.

11. The apparatus of claim 8, wherein the means for moving the focal point of the laser beam comprises an actuator operable to linearly move a focusing lens in a path of the laser beam.

12. The apparatus of claim 8, wherein the means for moving the focal point of the laser beam comprises a rotatable disk carrying a plurality of focusing lenses in a path of the laser beam.

13. The apparatus of claim 8, wherein the means for moving the focal point of the laser beam comprises an electro-optic modulator in a path of the laser beam.

14. Apparatus for high resolution, high speed laser drilling of an advancing product, comprising:

means for advancing the product in a predetermined product advancement path at a product advancement speed;

a laser-generating source providing a pulsed laser beam having a laser-on time and a laser-off time; and a rotatable reflecting polygon scanner for directing a focal point of the laser beam onto the advancing product, the rotating reflecting polygon scanner being operable to drill a high resolution hole in the product by moving the focal point of the laser beam in a direction of the product advancement path at a speed no greater than the product advancement speed during the laser-on time and to move the focal point of the laser beam in a direction opposite to the direction of the product advancement path during the laser-off time.

* * * * *